(12) United States Patent
Singnurkar

(10) Patent No.: US 8,085,092 B2
(45) Date of Patent: Dec. 27, 2011

(54) AMPLIFIER ARRANGEMENT AND METHOD FOR AMPLIFICATION

(75) Inventor: Pramod Singnurkar, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 0 days.

(21) Appl. No.: 12/375,198

(22) PCT Filed: Jul. 25, 2007

(86) PCT No.: PCT/EP2007/057685
§ 371 (c)(1),
(2), (4) Date: Oct. 19, 2009

(87) PCT Pub. No.: WO2008/012334
PCT Pub. Date: Jan. 31, 2008

(65) Prior Publication Data
US 2010/0039177 A1     Feb. 18, 2010

(30) Foreign Application Priority Data

Jul. 26, 2006  (EP) .................................. 06015604

(51) Int. Cl.
*H03F 3/45* (2006.01)
(52) U.S. Cl. ......................................................... 330/257
(58) Field of Classification Search .................. 330/257, 330/260; 323/259
See application file for complete search history.

(56) References Cited

U.S. PATENT DOCUMENTS

| | | | |
|---|---|---|---|
| 4,427,903 A | 1/1984 | Sugimoto | |
| 4,675,594 A | 6/1987 | Reinke | |
| 4,931,718 A | 6/1990 | Zitta | |
| 5,053,718 A * | 10/1991 | Graeme et al. | 330/260 |
| 5,212,458 A | 5/1993 | Fitzpatrick et al. | |
| 5,502,410 A | 3/1996 | Dunn et al. | |
| 5,963,085 A | 10/1999 | Sauer | |
| 5,973,561 A | 10/1999 | Heaton | |
| 6,525,607 B1 | 2/2003 | Liu | |
| 6,586,980 B1 | 7/2003 | Callahan, Jr. | |
| 6,747,514 B1 | 6/2004 | Aude | |
| 6,768,371 B1 | 7/2004 | Layton et al. | |
| 7,196,555 B2 | 3/2007 | Taylor | |
| 7,453,247 B2 * | 11/2008 | de Cremoux | 323/285 |

(Continued)

FOREIGN PATENT DOCUMENTS

DE           33 45 045         6/1984

(Continued)

OTHER PUBLICATIONS

C.Y. Leung et al., "A 1-V Integrated Current-Mode Boost Converter in Standard 3.3/5-V CMOS Technologies", IEEE Journal of Solid-State Circuits, vol. 40, No. 11, pp. 2265-2274, Nov. 2005.

(Continued)

*Primary Examiner* — Steven J Mottola
(74) *Attorney, Agent, or Firm* — Cozen O'Connor

(57) ABSTRACT

An amplifier arrangement comprises a first transistor (18), a first bias transistor (13) and a first field-effect transistor (51). A first input signal (VN) is supplied for amplification to a control terminal of the first transistor (18). The first bias transistor (13) is coupled to the first transistor (18) via a first node (12). The first field-effect transistor (51) is coupled for clamping of a first node voltage (V1) provided at the first node (12).

20 Claims, 2 Drawing Sheets

U.S. PATENT DOCUMENTS

| | | |
|---|---|---|
| 2004/0113696 A1 | 6/2004 | Forejt et al. |
| 2006/0017504 A1 | 1/2006 | Deval et al. |
| 2008/0048738 A1 | 2/2008 | Singnurkar |

FOREIGN PATENT DOCUMENTS

| | | |
|---|---|---|
| EP | 0 715 239 | 6/1996 |
| EP | 1 884 856 | 2/2008 |
| EP | 1 921 747 | 5/2008 |

OTHER PUBLICATIONS

D.M. Binkley et al., "Micropower, 0.35 μm/m partially depleted SOI CMOS preamplifiers having low white and flicker noise", 2003 IEEE Int'l. SOI Conference Proceedings, Newport Beach, CA, Sep. 29-Oct. 2, 2003, IEEE Int'l. SOI Conference, New York, NY:IEEE, U.S., Sep. 29, 2003, pp. 85-86.

T. Fukumoto et al., "Optimizng Bias-circuit Design of Cascode Operational Amplifier for Wide Dynamic Range Operations", Proceedings of the 2001 Int'l. Symposium on Low Power Electronics and Design, ISLPED, Huntington Beach, CA, Aug. 6-7, 2001, Int'l. Symposium on Low Power Electronics and Design, New York, NY: ACM, U.S., Aug. 6, 2001, pp. 305-309.

Y. Wang et al., "A 3-V High-Bandwidth Integrator for Magnetic Disk Read Channel Continuous-Time Filtering Applications", Custom Integrated Circuits Conference, 1998. Proceedings of the IEEE 1998 Santa Clara, CA, USA, May 11-14, 1998, New York, NY, USA, IEEE U.S., May 11, 1998, pp. 427-430.

G.A. Rincón-Mora, et al., "Accurate and Lossless Current-Sensing Techniques for Power Applications—A Practical Myth?", Power Management Design Line, dated Mar. 16, 2005.

C.Y. Leung et al., "An Integrated CMOS Current-Sensing Circuit for Low-Voltage Current-Mode Buck Regulator", IEEE Transactions on Circuits and Systems—II: Express Briefs, vol. 52, No. 7, pp. 394-397, Jul. 2005.

\* cited by examiner

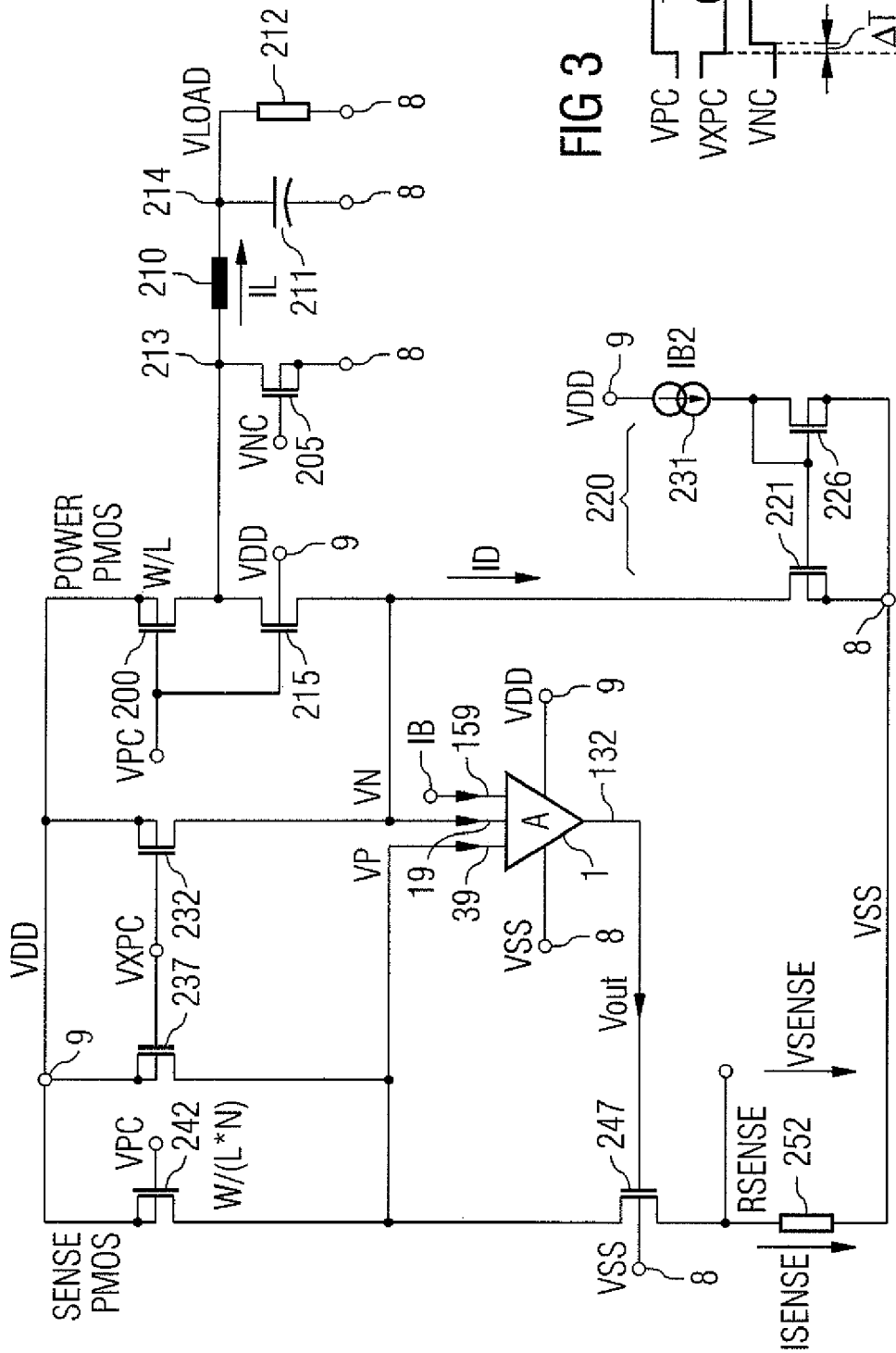
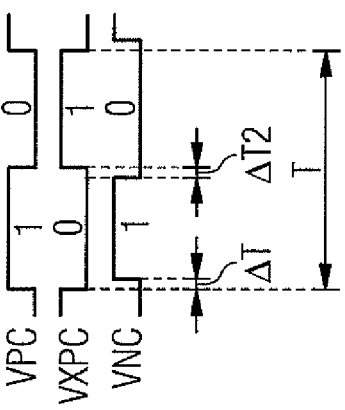
FIG 2
FIG 3

AMPLIFIER ARRANGEMENT AND METHOD FOR AMPLIFICATION

RELATED APPLICATIONS

This is a U.S. national stage under 35 USC §371 of application No. PCT/EP2007/057685, filed on Jul. 25, 2007.

This application claims the priority of European Patent Application 06015604.9 filed Jul. 26, 2006, the disclosure content of which is hereby incorporated by reference.

FIELD OF THE INVENTION

The present invention relates to an amplifier arrangement, a voltage converter comprising a measurement circuit for sensing a coil current with an amplifier arrangement, and a method for amplification.

BACKGROUND OF THE INVENTION

Amplifier arrangements are common in consumer electronics such as mobile phones and digital cameras, and in industrial electronics. Amplifier arrangements are also used in voltage converters which achieve an up- or a down-conversion of a supply voltage to generate an output voltage for electrical circuits. Voltage converters for down-conversion are, for example, buck mode converters, whereas voltage converters for up-conversion are, for example, boost converters. Voltage-mode and current-mode control arrangements are used in voltage converters. A current flowing through a coil is sensed in current-mode control arrangements.

Document "An Integrated CMOS Current-Sensing Circuit for Low-Voltage Current-Mode Buck Regulator", C. Y. Leung et al., IEEE Transactions on Circuits and Systems-II: Express Briefs, volume 52, number 7, July 2005, pages 394-397, shows a buck mode converter with a current-mode control arrangement for a minimum supply voltage of 1.2 V.

SUMMARY OF THE INVENTION

It is an object of the present invention to provide an amplifier arrangement, a voltage converter, and a method for amplification operating at low voltages and achieving a high amplification gain.

An amplifier arrangement comprises a first transistor, a first bias transistor, and a first field-effect transistor. The first bias transistor is coupled via a first node to the first transistor and the first field-effect transistor is coupled to the first bias transistor.

A first input signal is applied to a control terminal of the first transistor for the purpose of amplification of the first input signal. The first bias transistor provides a current to the first transistor. The first field-effect transistor achieves a clamping of a first node voltage which is provided at the first node.

It is an advantage of the clamping of the first node voltage at the first node that the voltage across the first bias transistor is decreased and the voltage across the first transistor is increased. Therefore, the amplifier achieves an amplification also with a low voltage supply. A gain of the amplifier arrangement is high because of the relatively high voltage drop across the first transistor, even at a low supply voltage.

In an embodiment, the first field-effect transistor comprises a control terminal which is connected to a terminal of the first bias transistor via the first node. The first field-effect transistor couples a control terminal of the first bias transistor to a first power supply terminal.

In a preferred embodiment, the amplifier arrangement comprises a first current path. The first current path comprises the first transistor, the first node and the first bias transistor and connects the first supply terminal to a second supply terminal.

In a preferred embodiment, the first transistor comprises a first terminal which is coupled to the second power supply terminal and a second terminal which is coupled to the first node. The first bias transistor comprises a control terminal, a first terminal which is coupled to the first power supply terminal and a second terminal which is coupled to the second terminal of the first transistor via the first node. The first field-effect transistor comprises the control terminal which is connected to the first node. Further on, the first field-effect transistor comprises a first terminal which is connected to the control terminal of the first bias transistor and is coupled to the second power supply terminal, and a second terminal which is coupled to the first power supply terminal.

In an embodiment, the first field-effect transistor is a metal-oxide-semiconductor field-effect transistor, abbreviated MOSFET. The first field-effect transistor can be a p-channel MOSFET. In a preferred embodiment, the first field-effect transistor is an n-channel MOSFET.

In a preferred embodiment, the voltage at the first supply terminal is higher than the voltage at the second supply terminal. In this preferred embodiment, the first bias transistor is realized as p-channel MOSFET, and the first transistor and the first field-effect transistor are realized as n-channel MOSFETs. In this embodiment, the gain of the amplifier arrangement is higher when realizing the first transistor as an n-channel MOSFET.

In an embodiment, the amplifier arrangement comprises a second transistor, a second node, a second bias transistor and a second field-effect transistor. The second transistor is coupled to the second bias transistor via the second node. A second current path comprises the second transistor, the second node and the second bias transistor. A second input signal is applied to a control terminal of the second transistor for amplification. A coupling of the second field-effect transistor to the second bias transistor is performed in such a way that clamping of a second node voltage at the second node is achieved. The first and the second transistors are coupled to achieve a differential amplification of the first and the second input signals. This coupling can be realized by connecting the first terminal of the first transistor to the first terminal of the second transistor and by coupling the two first terminals to the second supply terminal with a resistor, a current source or, preferably, a transistor.

In an embodiment, the second field-effect transistor comprises a control terminal which is connected to a terminal of the second bias transistor via the second node. The second field-effect transistor couples a control terminal of the second bias transistor to the first power supply terminal.

In an embodiment, a first resistor couples the node between the first transistor and the first bias transistor to the first terminal of the first field-effect transistor. In a preferred embodiment, the resistor is realized as a first coupling transistor. In an embodiment, a second resistor couples the node between the second transistor and the second bias transistor to the first terminal of the second field-effect transistor. In a preferred embodiment, the second resistor is realized as a second coupling resistor. The coupling transistors can be n-channel MOSFETs. Preferably, the coupling transistors are p-channel MOSFETs. By use of the first and the second resistors or the first and the second coupling transistors, respectively, the influence of process variations can be reduced.

In an embodiment, the amplifier arrangement comprises a third transistor and a third bias transistor which is coupled to the third transistor. The third bias transistor comprises a control terminal which is connected to a control terminal of the first bias transistor. In an embodiment, an output node of the amplifier arrangement is realized as a node between the third transistor and the third bias transistor.

In an embodiment, the amplifier arrangement comprises an output stage which couples the node between the third transistor and the third bias transistor to an output node of the amplifier arrangement.

In an embodiment, the amplifier arrangement comprises a current mirror with mirror transistors. The current mirror is coupled to a current input terminal of the amplifier arrangement, to the first field-effect transistor, to the second field-effect transistor and to the node between the first transistor and the second transistor.

According to an aspect of the invention, a voltage converter comprises a measurement circuit which itself comprises the amplifier arrangement. The measurement circuit is designed for sensing a coil current. In an embodiment, the voltage converter is realized as a boost-mode converter for up-conversion of the first supply voltage. In a preferred embodiment, the voltage converter is designed as a buck-mode converter, achieving a down-conversion of the first supply voltage. In a preferred embodiment, the voltage converter comprises a current-mode control arrangement. In a preferred embodiment, the measurement circuit uses the error-amplifier voltage mirror principle.

In an embodiment, the voltage converter comprises a first and a second converter transistor which are coupled to a second signal input terminal of the amplifier arrangement and comprises a third and a fourth converter transistor which are coupled to a first signal input terminal of the amplifier arrangement. The first and the second signal input terminals are connected to the control terminals of the first and the second transistor of the amplifier arrangement.

In an embodiment, the first, the second, the third and the fourth converter transistor are field-effect transistors. A ratio of the channel width to the channel length of the fourth converter transistor is by a factor N greater than a ratio of the channel width to the channel length of the first converter transistor. The drain-source voltages of the first and the fourth converter transistors may approximately be equal. Therefore, the current flowing through the first converter transistor is approximately by the factor N smaller than a current flowing through the fourth converter transistor.

In an embodiment, the voltage converter comprises an inductance, realized as a coil, which is coupled to the fourth converter transistor. In an embodiment, the fourth converter transistor is realized in a power metal-oxide-semiconductor integration technique.

In an embodiment, the voltage converter comprises a fifth converter transistor, which is connected to the first and the second converter transistors, and a resistor. A control terminal of the fifth converter transistor is coupled to the output node of the amplifier arrangement. The resistor couples the fifth converter transistor to the first power supply terminal. The sum of the currents flowing through the first and the second converter transistors is also flowing through the fifth converter transistor and the resistor. If the first and the fourth converter transistors are switched on, the current flowing through the resistor is approximately by the factor N smaller than the current flowing through the fourth converter transistor. The voltage of an output node between the resistor and the fifth converter transistor is an output voltage of the measurement circuit which is proportional by the product of the factor N and the value of the resistor to the current flowing through the fourth converter transistor. Because the current through the fourth converter transistor approximately equals the current through the coil the current through the resistor, the voltage at the output node can be used for the measurement of the current through the coil of the voltage converter. The fifth converter transistor is preferably designed as an n-channel field-effect transistor.

In a preferred embodiment, the voltage converter with the amplifier arrangement is realized using a semiconductor body to which the coil is coupled. Preferably, the converter transistors are realized as MOSFETs.

According to an aspect of the invention, the method for amplification comprises the following steps: a first input signal is applied to a first transistor. A current is provided to the first transistor using a first bias transistor. A first node voltage is provided at a first node between the first transistor and the first bias transistor. The first node voltage is clamped using a first field-effect transistor. It is an advantage of the clamping of the first node and, therefore, also of the first bias transistor that a voltage across the first bias transistor is reduced and a voltage across the first transistor is increased and, therefore, a high gain of the amplification is achieved.

In an embodiment, a first node voltage is provided at the first node and is applied to a control terminal of the first field-effect transistor. The first field-effect transistor couples a control terminal of the first bias transistor to a first power supply terminal. A voltage at the control terminal of the first bias transistor is advantageously generated from a first supply voltage via the first field-effect transistor. The first supply voltage is provided at the first power supply terminal.

BRIEF DESCRIPTION OF THE DRAWINGS

The following description of figures of exemplary embodiments may further illustrate and explain the invention. Devices with the same structure or the same effect, respectively, appear with equivalent reference numerals. A description of a part of a circuit or a device having the same function in different figures might not be repeated in every one of the following figures.

FIG. 2 shows a schematic of an exemplary embodiment of a voltage converter, and FIG. 3 shows an exemplary embodiment of the first, the second and the third control signals.

DETAILED DESCRIPTION OF THE DRAWINGS

Figure 1:
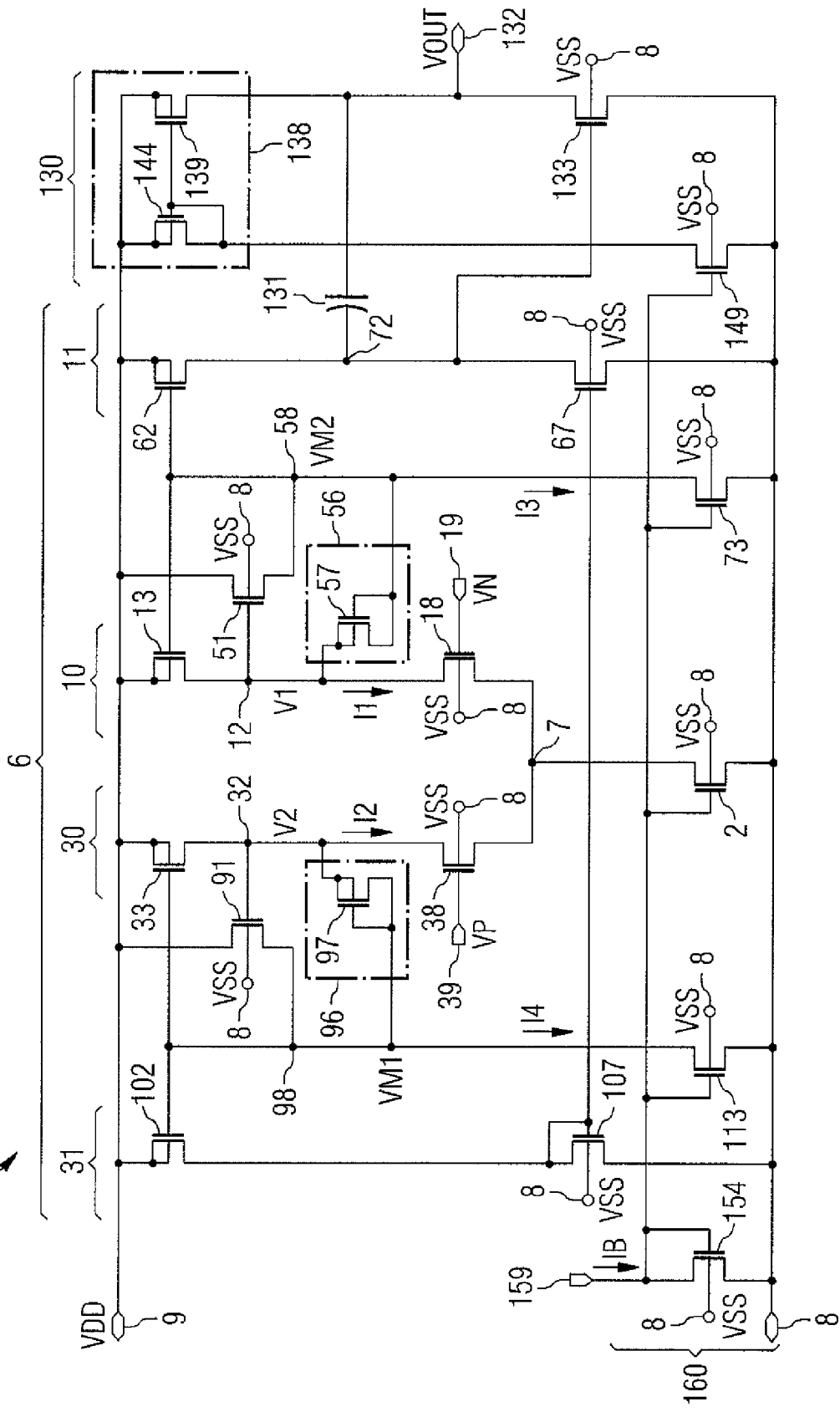
FIG. 1 shows a schematic of an exemplary embodiment of an amplifier arrangement.

FIG. 1 shows an exemplary embodiment of an amplifier arrangement 1. The amplifier arrangement 1 comprises a first and a second transistor 18, 38 with first terminals which are connected to a node 7, which is coupled to a second power supply terminal 8. A first and a second bias transistor 13, 33 of the amplifier arrangement 1 comprise first terminals which are connected to a first power supply terminal 9. A second terminal of the first bias transistor 13 is connected to a second terminal of the first transistor 18 via a first node 12 and a second terminal of the second bias transistor 33 is connected to a second terminal of the second transistor 38 via a second node 32. The amplifier arrangement 1 comprises a first and a second field-effect transistor 51, 91 with second terminals which are connected to the first power supply terminal 9. A control terminal of the first field-effect transistor 51 is connected to the first node 12 and, therefore, with the second terminal of the first bias transistor 13. A first terminal of the first field-effect transistor 51 is connected to a control terminal of the first bias transistor 13. In an analogous manner, a control terminal of the second field-effect transistor 91 is connected to the second node 32, and, therefore, also with the second terminal of the second bias transistor 33. A first terminal of the second field-effect transistor 91 is connected to a control terminal of the second bias transistor 33.

A first resistor 56 of the amplifier arrangement 1 couples the first node 12 to a third node 58 which is connected to the first terminal of the first field-effect transistor 51. A second resistor 96 of the amplifier arrangement 1 couples the second node 32 to a fourth node 98 which is connected to the first terminal of the second field-effect transistor 91. The first and the second resistors 56, 96 are realized as a first and a second coupling transistor 57, 97. The first terminal of the first coupling transistor 57 is connected to the first node 12. A control terminal of the first coupling transistor 57 is connected to a second terminal of the first coupling transistor 57 and to the first terminal of the first field-effect transistor 51. In an analogous manner, a first terminal of the second coupling transistor 97 is connected to the second node 32. A control terminal and a second terminal of the second coupling transistor 97 are connected together and are connected to the first terminal of the second field-effect transistor 91.

A third and a fourth bias transistor 62, 102 of the amplifier arrangement 1 each comprise a respective first terminal which is connected to the first power supply terminal 9. A control terminal of the third bias transistor 62 is connected to the control terminal of the first bias transistor 13. In an analogous manner, a control terminal of the fourth bias transistor 102 is connected to the control terminal of the third bias transistor 33. A third and a fourth transistor 67, 107 of the amplifier arrangement 1 each comprise a respective first terminal which is connected to the second power supply terminal 8. A second terminal of the third transistor 67 is connected to a second terminal of the third bias transistor 62. In a corresponding manner, a second terminal of the fourth transistor 107 is connected to a second terminal of the fourth bias transistor 102. A control terminal of the third transistor 67 is connected to a control terminal of the fourth transistor 107 and in addition also to the second terminal of the fourth transistor 107, so that a current mirror is achieved. A node 72 between the third transistor 67 and the third bias transistor 62 is an output node of the input stage 6 of the amplifier arrangement 1 comprising the first, the second, the third and the fourth transistors 18, 38, 67, 107 and the first and the second field-effect transistors 51, 91 and the first, the second, the third and the fourth bias transistors 13, 33, 62, 102. This node 72 may act also as an output node of the amplifier arrangement 1.

The amplifier arrangement further comprises an output stage 130. The output stage 130 comprises a fifth transistor 133, a current mirror 138, a capacitor 131, and an output node 132 of the amplifier arrangement 1. The node 72 is connected to a control terminal of the fifth transistor 133. A first terminal of the fifth transistor 133 is connected to the second power supply terminal 8. A second terminal of the fifth transistor 133 is connected to the output node 132 of the amplifier arrangement 1 and also to the current mirror 138. The current mirror 138 couples the second terminal of the fifth transistor 133 to the first power supply terminal 9. The current mirror 138 comprises a fifth and a sixth bias transistor 139 and 144 with first terminals which are connected to the first power supply terminal 9. A second terminal of the fifth bias transistor 139 is connected to the second terminal of the fifth transistor 133. A control terminal of the fifth bias transistor 139 is connected to a control terminal of the sixth bias transistor 144 and also to a second terminal of the sixth bias transistor 144. The second terminal of the sixth bias transistor 144 is coupled to the second power supply terminal 8. The capacitor 131 couples the node 72 to the output node 132 of the amplifier arrangement.

A second minor 160 of the amplifier arrangement 1 comprises a first, a second, a third, a fourth and a fifth mirror transistor 154, 113, 2, 73, 149 with first terminals which are connected to the second power supply terminal 8. The control terminals are connected together and are connected to the second terminal of the first mirror transistor 154 and to a current supply terminal 159. A second terminal of the second mirror transistor 113 is connected to the first terminal of the second field-effect transistor 91, and therefore, also to the control terminals of the second and the fourth bias transistors 33, 102. A second terminal of the third mirror transistor 2 is connected to the node 7 between the first and the second transistor 18, 38. A second terminal of the fourth mirror transistor 73 is connected to the first terminal of the first field-effect transistor 51. A second terminal of the fifth mirror transistor 149 is connected to the first current mirror 138 and, therefore, is connected to the second terminal of the sixth bias transistor 144.

A first input signal VN is supplied to a first signal input terminal 19 which is coupled with a control terminal of the first transistor 18 and a second input signal VP is supplied to a second signal input terminal 39 which is a control terminal of the second transistor 38. Because the node 7 between the first and the second transistors 18, 38 is coupled to the second power supply terminal 8 via the third mirror transistor 2, the first and the second input signals VN, VP are amplified in a differential manner. The first and the second field-effect transistors 51, 91 achieve a small voltage between the first and the second terminals of the first bias transistor 13 and between the first and the second terminals of the second bias transistor 33. Therefore, a voltage between the first and the second terminals of the first transistor 18 and between the first and the second terminals of the second transistor 38 obtains a high value, yielding a high gain of the amplification of the first and the second input signals VN, VP. An amplified signal of the first input signal VN is applied to the control terminal of the third bias transistor 62 and, therefore, also to the node 72 between the third transistor 67 and the third bias transistor 62. An amplified signal of the second input signal VP is applied in an analogous manner to the control terminal of the fourth bias transistor 102. Because the third and the fourth transistors 67, 107 are coupled together, the amplified signal of the second input signal VP also influences a voltage at the node 72. The voltage at the node 72 is amplified by the output stage 130 of the amplifier arrangement 1 using the fifth transistor 133 for amplification. A bias current for the fifth transistor 133 is supplied by the first current mirror 138. An output voltage VOUT is provided at the output node 132 of the amplifier arrangement 1. The first and the second input signals VN, VP are amplified in a differential manner resulting in a voltage at the node 72. The voltage at the node 72 is amplified in a non-differential manner so that the output voltage VOUT of the amplifier arrangement 1 is provided.

The transistors are realized as field-effect transistors in the form of MOSFETs. A first supply voltage VDD is applied at the first power supply terminal 9 and a second supply voltage VSS is provided at the second power supply terminal 8. The first supply voltage VDD is higher than the second supply voltage VSS. The first terminals of the transistors can be realized as a source terminal of the respective field-effect transistors and, therefore, the second terminals of all the transistors can be a drain terminal of the field-effect transistors. The control terminals of all the transistors are realized as gate electrodes of the field-effect transistors. The first, the second, the third, the fourth, and the fifth transistors 18, 38, 67, 107, 133 and the five mirror transistors 154, 113, 2, 73, 149 are realized as n-channel field-effect transistors. The first, the second, the third, the fourth, the fifth and the sixth bias transistors 13, 33, 62, 102, 139, 144 are realized as p-channel field-effect transistors. The first and the second coupling transistors 57, 97 are realized as p-channel field-effect transistors.

It is an advantage of the realization of the first and the second transistor 18, 38 as n-channel field-effect transistors that the amplification achieved by an n-channel transistor is higher than the amplification achieved by a p-channel field-effect transistor with the same transistor area. The input stage of the amplifier arrangement, comprising the first, the second, the third and the fourth transistors 18, 38, 67, 107, being constructed symmetrically, results in a low offset value of the amplifier arrangement. It is an advantage of the output stage 130 that it increases the gain of the amplifier arrangement.

In an alternative embodiment, the amplifier arrangement 1 does not comprise a first and a second resistor 56, 96 and the first and the second coupling transistor 57, 97.

FIG. 2 shows an exemplary embodiment of a voltage converter. The focus of the voltage converter shown in FIG. 2 is directed to a measurement circuit which is designed for the measurement of a current through a fourth converter transistor 200 which is approximately equivalent to a current through a coil 210 of the voltage converter. FIG. 2 shows the voltage converter realized as a buck-mode converter for down-conversion of the first supply voltage VDD. The voltage converter comprises the amplifier arrangement 1 of which an exemplary embodiment is shown in FIG. 1. The voltage converter comprises a first, a second and a third converter transistor 242, 237, 232. The first terminals of these four converter transistors 242, 237, 232, 200 are connected to the first power supply terminal 9. A second terminal of the first converter transistor 242 and a second terminal of the second converter transistor 237 are connected together and are connected to the second signal input 39 of the amplifier arrangement 1. A second terminal of the third converter transistor 232 is connected to the first signal input terminal 19 of the amplifier arrangement 1. A second terminal of the fourth converter transistor 200 is coupled to the first signal input terminal 19. This coupling is achieved by a sixth converter transistor 215 with a first terminal which is connected to the second terminal of the fourth converter transistor 200. A second terminal of the sixth converter transistor 215 is connected to the first signal input terminal 19.

The voltage converter further comprises a fifth converter transistor 247 and a resistor 252. A second terminal of the fifth converter transistor 247 is connected to the second terminals of the second and first converter transistors 242, 237. The control terminal of the fifth converter transistor 247 is connected to the output node 132 of the amplifier arrangement 1. A first terminal of the fifth converter transistor 247 is coupled to the second power supply terminal 8 via the resistor 252. The second terminal of the third converter transistor 232 and the second terminal 218 of the sixth converter transistor 215 are coupled via a current mirror 220 to the second power supply terminal 8. The current mirror 220 comprises an eighth and a ninth converter transistor 221, 226 with first terminals which are connected to the second power supply terminal 8. A second terminal of the eighth converter transistor 222 is connected to the second terminal of the sixth converter transistor 215. A control terminal of the eighth converter transistor 221 is connected to a control terminal of the ninth converter transistor 226 and also to a second terminal of the ninth converter transistor 206. The current mirror 220 further comprises a current source 231 which couples the ninth converter transistor 226 to the first power supply terminal 9.

The voltage converter further comprises a seventh converter transistor 205 which couples the second terminal of the fourth converter transistor 200 to the second power supply terminal 8. A second terminal of the seventh converter transistor 205 is connected to the second terminal of the fourth converter transistor 200 and to a terminal of the coil 210. A further terminal of the coil 210 is coupled to a load of the voltage converter represented by a capacitor 211 and a resistor 212.

The first, the second, the third, the fourth and the sixth converter transistors 242, 237, 232, 200, 215 are realized as p-channel MOSFETs. The fifth, the seventh, the eighth, and the ninth converter transistors 247, 205, 221, 226 are realized as n-channel MOSFETs. A first control signal VP is applied to the control terminals of the first, the fourth and the sixth converter transistors 242, 200, 215. A second control signal VXP is applied to the control terminals of the second and the third converter transistors 237, 232. A third control signal VN is applied to the control terminal 206 of the seventh converter transistor 205. The mode of operation is described with reference to FIG. 3.

FIG. 3 shows an exemplary embodiment of the first, the second, and the third control signals VPC, VXPC, VNC. The second control signal VXPC is an inverted signal of the first control signal VPC. The third control signal VNC is approximately the first control signal VPC with a small difference: a rising edge of the third control signal VNC is by a time difference ΔT later than a rise of the first control signal VPC and a falling edge of the third control signal VNC is by a time difference ΔT1 earlier than a fall of the first control signal VPC. When the first control signal VPC is in a high state, the first, the fourth and the sixth converter transistors 242, 200, 215 are switched off. The second and the third converter transistors 237, 232 are switched on by the second control signal VXPC and are generating the first and the second input signals VN, VP for the amplifier arrangement 1. Because the current mirror 220 is also connected to the first input signal terminal 19 of the amplifier arrangement 1 and because the amplifier arrangement is designed for the purpose that the first and the second input signals VN, VP are approximately equal, the output voltage VOUT of the amplifier arrangement 1 provided at the output node 132 of the amplifier arrangement 1 obtains such a value that a current ISENSE flowing through the eighth converter transistor 247 and the resistor 252 is approximately equal to the current flowing through the fourth converter transistor 200. The seventh converter transistor 205 is also switched on. If electric energy is stored in the coil 210, a coil current IL can flow from the second supply terminal 8 through the seventh converter transistor 205 and the coil 210 to the load represented by the capacitor 211 and the resistor 212.

In a second state of operation, the first control signal VPC is in a low state and, therefore, the first, the fourth and the sixth converter transistors 242, 200, 215 are switched on. The second, the third and the seventh converter transistors 237, 232, 205 are switched off during the second state of operation by the second and the third control signals VXPC, VNC. The coil current IL can now flow from the first supply terminal 9 through the fourth converter transistor 200 and through the coil 210 to the load represented by the capacitor 211 and the resistor 212. Because a current ID flowing through the eighth converter transistor 221 of the current mirror 220 is small compared with the coil current IL, the voltage between the first and the second terminals of the sixth converter transistor 215 is small in comparison with the voltage between the first and the second terminals of the fourth converter transistor 200. Therefore, the voltage between the first and the second terminals of the fourth converter transistor 200 is approximately equal to the voltage between the first and the second terminals of the first converter transistor 242. The fourth converter transistor 202 is realized with a ratio of the channel width to the channel length W/L. The first converter transistor 242 is realized with a smaller ratio of the width of the channel to the length of the channel. The width-to-length ratios differ by a factor N. Because the voltages between the first and the second terminals of the first and the fourth converter transistors 242, 200 are approximately equal and the ratios of the channel width to the channel length is smaller in the case of the first converter transistor 242, a current flows through the first converter transistor 242 which is by the factor N smaller than the current through the fourth converter transistor 200 which is approximately the coil current IL. The output voltage VOUT of the amplifier arrangement 1 is provided in such a way that the first and the second input signals VN, VP are approximately equal also in the second state of operation.

The current flowing through the first converter transistor 242 also flows through the resistor 252 and the fifth converter transistor 247. The output voltage VOUT of the amplifier arrangement 1 controls the current through the fifth converter transistor 247 in such a way that the first and the second input signals VP, VN for the amplifier arrangement 1 are approximately equal. Therefore, the current through the resistor 252 is proportional to the current through the fourth converter transistor 200 and the coil current IL by the factor N. The first supply voltage VDD is provided to the first power supply terminal 9 and the second supply voltage VSS is provided to the second power supply terminal 8. A sense current ISENSE flows through the resistor 252 and a sense voltage VSENSE is provided at a node between the resistor 252 and the fifth converter transistor 247. Therefore, the voltage converter according to FIG. 2 provides the current ISENSE and the voltage VSENSE in such a way that it can be used for the measurement of the coil current IL because a constant and known proportionality factor between the coil current IL and the sense current ISENSE through the resistor 252 is provided.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An amplifier arrangement, comprising:
a first transistor with a control terminal to which a first input signal is supplied for amplification;
a first bias transistor which is coupled to the first transistor via a first node; and
a first field-effect transistor for clamping of a first node voltage which is provided at the first node,
wherein a first terminal of the first bias transistor is coupled to a first power supply terminal, the first field-effect transistor comprises a control terminal which is connected to a second terminal of the first bias transistor via the first node, the second terminal of the first bias transistor is coupled to the first transistor via the first node, a first terminal of the first field-effect transistor is connected to a control terminal of the first bias transistor and a second terminal of the first field-effect transistor is coupled to the first power supply terminal.

2. The amplifier arrangement according to claim 1, wherein the first field-effect transistor is a metal-oxide-semiconductor field-effect transistor.

3. The amplifier arrangement according to claim 1, wherein the first transistor, the first node and the first bias transistor are comprised by a first current path between the first supply terminal and a second supply terminal.

4. The amplifier arrangement according to claim 1, wherein a first coupling transistor comprises a control terminal which is connected to a second terminal of the first coupling transistor and the first coupling transistor couples the first node to a third node between a first terminal of the first field-effect transistor and the control terminal of the first bias transistor.

5. The amplifier arrangement according to claim 3,
wherein a first coupling transistor comprises a control terminal which is connected to a second terminal of the first coupling transistor and the first coupling transistor couples the first node to a third node between a first terminal of the first field-effect transistor and the control terminal of the first bias transistor;
wherein a voltage at the first supply terminal is higher than a voltage at the second supply terminal,
wherein the first bias transistor and the first coupling transistor are p-channel field-effect transistors, and
wherein the first transistor and the first field-effect transistor are n-channel field-effect transistors.

6. The amplifier arrangement according to claim 1, wherein the amplifier arrangement comprises:
a second transistor with a control terminal to which a second input signal is supplied for amplification,
a second bias transistor which is coupled to the second transistor via a second node, and
a second field-effect transistor for clamping of a second node voltage which is provided at the second node,
wherein the first and the second transistors are coupled to each other to provide a differential amplification of the first and the second input signals.

7. The amplifier arrangement according to claim 6, wherein the second field-effect transistor is a metal-oxide-semiconductor field-effect transistor.

8. The amplifier arrangement according to claim 1, wherein the amplifier arrangement comprises a third current path with a third transistor, and a third bias transistor which is coupled to the third transistor and which comprises a control terminal which is connected to a control terminal of the first bias transistor.

9. The amplifier arrangement according to claim 8, wherein the amplifier arrangement comprises a fourth current path with a fourth transistor with a control terminal which is coupled to a second terminal of the fourth transistor and to a control terminal of the third transistor, and a fourth bias transistor which is coupled to the fourth transistor and which comprises a control terminal which is connected to a control terminal of a second bias transistor.

10. The amplifier arrangement according to claim 9, wherein a second current path comprises the second transistor, the second node and the second bias transistor, a current in the fourth current path is a linear function of a second current in the second current path, and a first current in the first current path and a second current in the second current path are compared by a current comparator formed by the third bias transistor and the third transistor.

11. The amplifier arrangement according to claim 8, wherein the amplifier arrangement comprises an output stage, comprising:

a fifth transistor with a control terminal which is coupled to a node between the third transistor and the third bias transistor, and an output node of the amplifier arrangement, which is coupled to a second terminal of the fifth transistor.

12. A voltage converter, comprising a measurement circuit for sensing a coil current with an amplifier arrangement according to claim 1.

13. The voltage converter according to claim 12, wherein the amplifier arrangement comprises:

a second transistor with a control terminal to which a second input signal is supplied for amplification, a second bias transistor which is coupled to the second transistor via a second node and a second field-effect transistor for clamping of a second node voltage which is provided at the second node, and the voltage converter further comprising:

a first converter transistor which is coupled to the control terminal of the second transistor of the amplifier arrangement and comprises a control terminal to which a first control signal is supplied, and a second converter transistor which is coupled to the control terminal of the second transistor of the amplifier arrangement and comprises a control terminal to which a second control signal is supplied.

14. The voltage converter according to claim 13, wherein the voltage converter comprises:

a third converter transistor which is coupled to the control terminal of the first transistor of the amplifier arrangement and comprises a control terminal to which the second control signal is supplied, and a fourth converter transistor which is coupled to the control terminal of the first transistor of the amplifier arrangement and comprises a control terminal to which the first control signal is supplied.

15. The voltage converter according to claim 14, wherein the first and the fourth converter transistors are field-effect transistors and wherein a ratio of the channel width to the channel length W/L of the fourth converter transistor is by a factor N greater than a ratio of the channel width to the channel length of the first converter transistor.

16. The voltage converter according to claim 13, wherein the voltage converter comprises:

a resistor, and a fifth converter transistor which couples the resistor to the control terminal of the second transistor of the amplifier arrangement.

17. The voltage converter according to claim 16, wherein the fifth converter transistor is a n-channel metal-oxide-semiconductor field-effect transistor.

18. A method for amplification, comprising the steps of:

providing a first input signal to a first transistor;

providing a current to the first transistor using a first bias transistor; and clamping a first node between the first transistor and the first bias transistor using a first field-effect transistor by supplying a first node voltage which is provided at the first node to a control terminal of the first field-effect transistor, a first terminal of the first bias transistor being coupled to a first power supply terminal, a second terminal of the first bias transistor being coupled to the first transistor via the first node, a first terminal of the first field-effect transistor being connected to a control terminal of the first bias transistor and a second terminal of the first field-effect transistor being coupled to the first power supply terminal.

19. An amplifier arrangement, comprising:

a first transistor with a control terminal to which a first input signal is supplied for amplification;

a first bias transistor which is coupled to the first transistor via a first node;

a first field-effect transistor for clamping of a first node voltage which is provided at the first node; and a first coupling transistor comprising a control terminal which is connected to a second terminal of the first coupling transistor, the first coupling transistor coupling the first node to a third node between a first terminal of the first field-effect transistor and a control terminal of the first bias transistor;

wherein a first terminal of the first bias transistor is coupled to a first power supply terminal, the first field-effect transistor comprises a control terminal which is connected to a second terminal of the first bias transistor via the first node, and the second terminal of the first bias transistor is coupled to the first transistor via the first node.

20. An amplifier arrangement, comprising:

a first transistor with a control terminal to which a first input signal is supplied for amplification;

a first bias transistor which is coupled to the first transistor via a first node; and a first field-effect transistor for clamping of a first node voltage which is provided at the first node;

a second transistor with a control terminal to which a second input signal is supplied;

a second bias transistor; and a third current path with a third transistor, and a third bias transistor which is coupled to the third transistor and which comprises a control terminal which is connected to a control terminal of the first bias transistor;

wherein a first terminal of the first bias transistor is coupled to a power supply terminal, a first terminal of the second bias transistor is coupled to the power supply terminal and a second terminal of the second bias transistor is coupled to a second terminal of the second transistor via a second node, the first field-effect transistor comprises a control terminal which is connected to a second terminal of the first bias transistor via the first node, the second terminal of the first bias transistor is coupled to the first transistor via the first node, and a first terminal of the first transistor and a first terminal of the second transistor are connected to a third node.

* * * * *